(12) United States Patent
Collins et al.

(10) Patent No.: US 9,330,887 B2
(45) Date of Patent: *May 3, 2016

(54) PLASMA REACTOR WITH TILTABLE OVERHEAD RF INDUCTIVE SOURCE

(71) Applicant: APPLIED MATERIALS, INC., Santa Clara, CA (US)

(72) Inventors: Kenneth S. Collins, San Jose, CA (US); Andrew Nguyen, San Jose, CA (US); Martin Jeffrey Salinas, San Jose, CA (US); Imad Yousif, San Jose, CA (US); Ming Xu, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 265 days.

This patent is subject to a terminal disclaimer.

(21) Appl. No.: 13/783,776

(22) Filed: Mar. 4, 2013

(65) Prior Publication Data

US 2013/0206594 A1  Aug. 15, 2013

Related U.S. Application Data

(62) Division of application No. 12/787,198, filed on May 25, 2010, now Pat. No. 8,414,736.

(60) Provisional application No. 61/239,711, filed on Sep. 3, 2009.

(51) Int. Cl.

| C23C 16/00 | (2006.01) |
| C23F 1/00 | (2006.01) |
| H01L 21/306 | (2006.01) |
| H01J 7/24 | (2006.01) |
| H05B 31/26 | (2006.01) |
| H01J 37/32 | (2006.01) |

(52) U.S. Cl.
CPC ......... *H01J 37/32082* (2013.01); *H01J 37/321* (2013.01); *H01J 37/3211* (2013.01); *H01J 37/32935* (2013.01)

(58) Field of Classification Search
CPC   H01J 37/321; H01J 37/3211; H01J 37/32082
USPC ........ 156/345.48, 345.49; 118/723 I, 723 IR; 315/111.51

See application file for complete search history.

(56) References Cited

U.S. PATENT DOCUMENTS

| 5,280,154 A | 1/1994 | Cuomo et al. |
| 5,433,812 A | 7/1995 | Cuomo et al. |
| 5,749,966 A * | 5/1998 | Shates ............................ 117/79 |
| 5,855,681 A | 1/1999 | Maydan et al. |
| 6,617,794 B2 | 9/2003 | Barnes et al. |
| 2001/0022157 A1 | 9/2001 | Shin et al. |
| 2005/0034815 A1 | 2/2005 | Kasai et al. |
| 2007/0181257 A1 | 8/2007 | Comendant et al. |
| 2007/0256787 A1 | 11/2007 | Chandrachood et al. |
| 2008/0084649 A1* | 4/2008 | Chang et al. .................. 361/234 |
| 2008/0171444 A1 | 7/2008 | Dhindsa et al. |
| 2009/0159425 A1 | 6/2009 | Liu et al. |

FOREIGN PATENT DOCUMENTS

JP        2003234293 A     8/2003

* cited by examiner

*Primary Examiner* — Rakesh Dhingra
(74) *Attorney, Agent, or Firm* — Robert M. Wallace

(57) ABSTRACT

Correction of skew in plasma etch rate distribution is performed by tilting the overhead RF source power applicator about a tilt axis whose angle is determined from skew in processing data. Complete freedom of movement is provided by incorporating exactly three axial motion servos supporting a floating plate from which the overhead RF source power applicator is suspended.

8 Claims, 8 Drawing Sheets

US 9,330,887 B2

PLASMA REACTOR WITH TILTABLE OVERHEAD RF INDUCTIVE SOURCE

CROSS-REFERENCE TO RELATED APPLICATIONS

This application is a divisional of U.S. patent application Ser. No. 12/787,193, filed May 25, 2010 entitled PLASMA REACTOR WITH TILTABLE OVERHEAD RF INDUCTIVE SOURCE, by Kenneth Collins, et al., which claims the benefit of U.S. Provisional Application Ser. No. 61/239,711, filed Sep. 3, 2009 entitled PLASMA REACTOR WITH TILTABLE OVERHEAD RF INDUCTIVE SOURCE, by Kenneth Collins, et al.

BACKGROUND

Plasma etch processes are employed in microelectronic circuit fabrication to define thin film structures on semiconductor wafers or workpieces. Generally, a disc-shaped workpiece is processed in a cylindrical reactor chamber. Features sizes in the thin film structures formed, by the etch process can be as small as tens of nanometers, for example. Uniformity of etch rate distribution across the entire surface of the workpiece is critical In attaining workable devices. The etch rate distribution reflects the plasma ion density distribution across the workpiece surface existing during the plasma etch processing of the workpiece. Etch processes can employ an inductively coupled RF plasma in which the plasma source consists of a coil antenna over the ceiling of the reactor chamber. The etch rate distribution can have a radial non-uniformity, in which the non-uniformity pattern is generally symmetrical about the cylindrical axis of symmetry of the reactor chamber. For example, the etch rate distribution may reflect a plasma ion density distribution that is, predominantly, either center-high or center low. Such a radial pattern of non-uniformity can be corrected by dividing the ceiling coil antenna into two or more concentric coil antennas that are separate from one another and are independently powered with RF power. Radial non-uniformity in etch is corrected in such a reactor by adjusting the RF power levels independently delivered to the separate concentric coil antennas. While this arrangement works well in correcting radial non-uniformities in etch rate distribution, it is not well-suited for correcting for asymmetrical non-uniformities in etch rate distribution. Such asymmetrical non-uniformities may be referred to as "skew" non-uniformities, and typically are manifested as a difference between etch rates on opposite sides of the workpiece. As one simplified example, one half of the workpiece may experience a higher etch rate than the other half. Under real production conditions, it is often found that the etch rate distribution measured across the surface of the workpiece has both radial non-uniformity and skew non-uniformity in combination. If the skew non-uniformity could be somehow corrected or eliminated, then the remaining non-uniformity, namely the radial non-uniformity, could foe eliminated, by apportioning the RF power levels delivered to the different concentric overhead coil antennas. The result would be correction of all etch rate distribution non-uniformity across the workpiece surface. The problem is how to eliminate the skew non-uniformity in etch rate distribution.

SUMMARY

A plasma reactor for processing a workpiece includes a processing chamber enclosure defining a process chamber interior and comprising a chamber side wall and a chamber ceiling, and a workpiece holder inside the process chamber interior and a conductive RF enclosure overlying the ceiling and comprising an RF enclosure side wall and an RF enclosure top cover. A shoulder ring is supported on the RF enclosure side wall, and a floating support plate is placed inside the conductive RF enclosure and adjacent the shoulder ring. Plural radially inner and outer RF plasma source power applicators are suspended from the floating support plate in a space below the floating support plate and above the chamber ceiling. Plural RF power sources are coupled to a corresponding one of the plural RF plasma power applicators. Plural actuators fixed with respect to the shoulder ring are spaced about the shoulder ring at periodic intervals. Each one of the plural actuators has an axially movable arm and a motor driving the movable arm in an axial direction. A rotatable joint having two joint ends is provided, one of the joint ends being connected to the axially movable arm and the other of the joint ends being connected, to a portion of the floating support plate adjacent the one actuator, whereby the floating plate is supported at respective plural locations by the rotatable joint of each respective one of the plural actuators. Only three actuators are provided in the preferred embodiment, to ensure complete freedom of movement of the floating support plate.

BRIEF DESCRIPTION OF THE DRAWINGS

So that the manner in which the exemplary embodiments of the present invention are attained and can be understood in detail, a more particular description of the invention, briefly summarized above, may be had by reference to the embodiments thereof which are illustrated in the appended drawings. It is to be appreciated that certain well known processes are not discussed herein in order to not obscure the invention.

Figure 1:
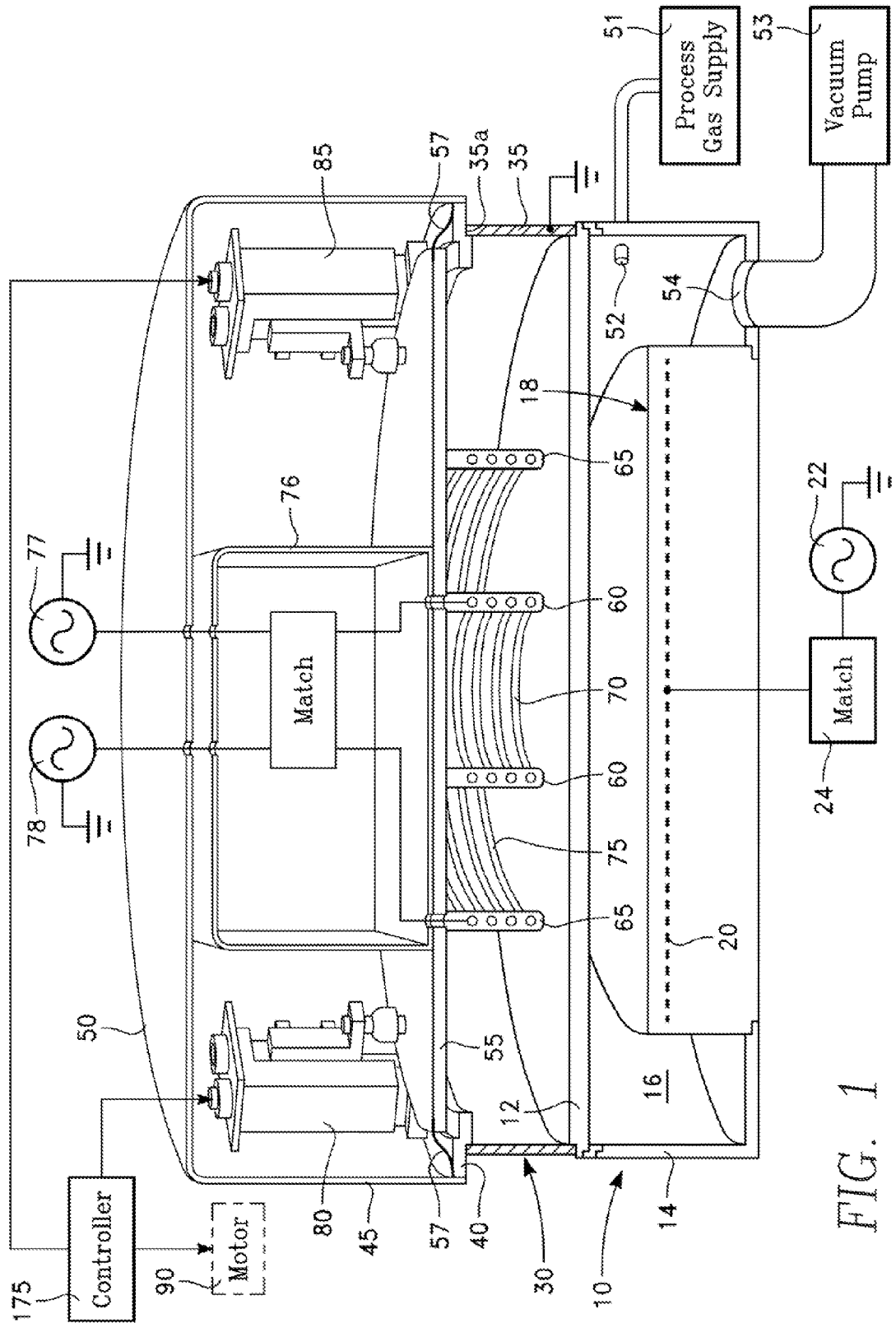
FIG. 1 is a partially cut-away side view of a reactor in accordance with an embodiment.
Figure 2:
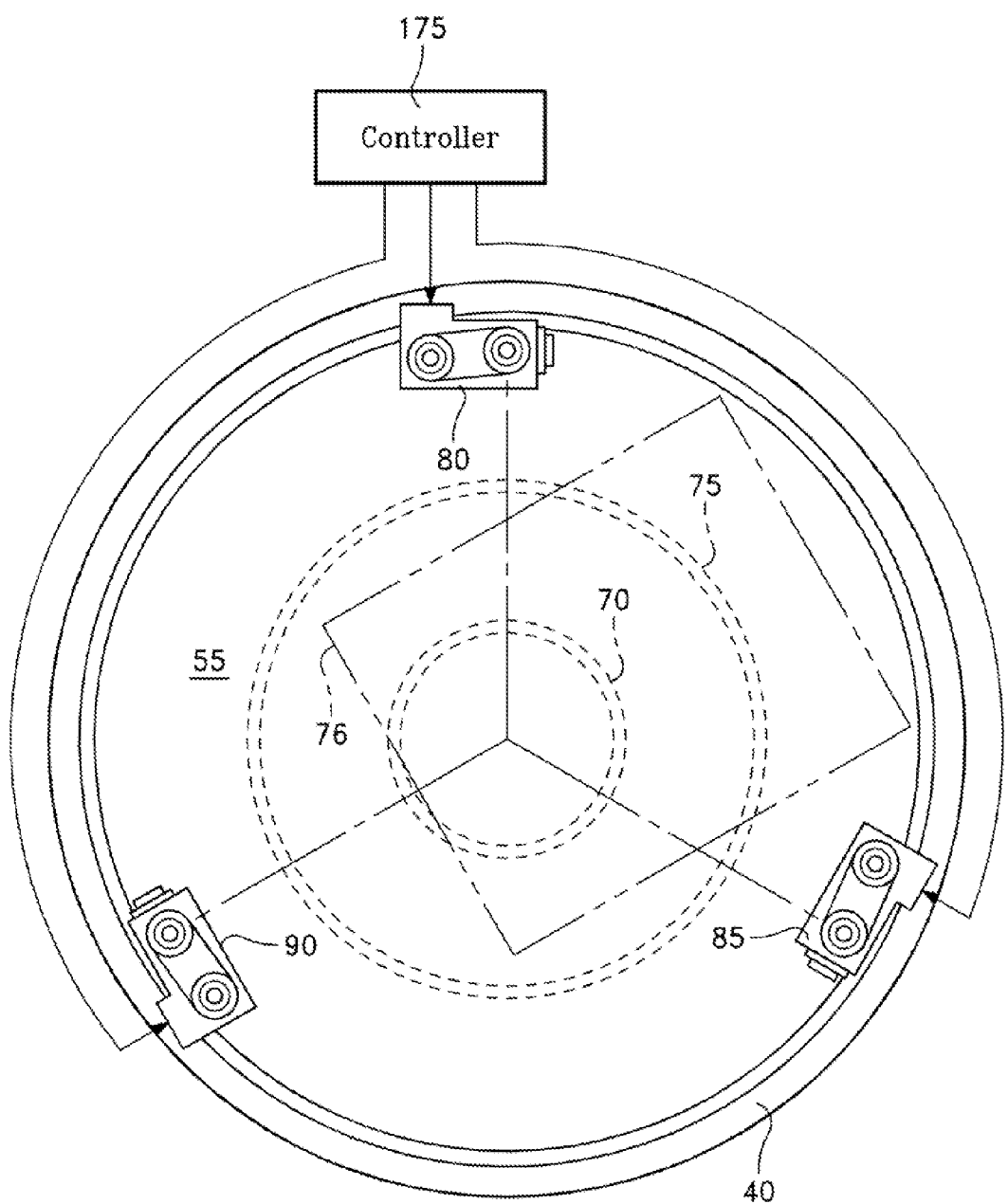
FIG. 2 is a top view corresponding to FIG. 1.
Figure 3:
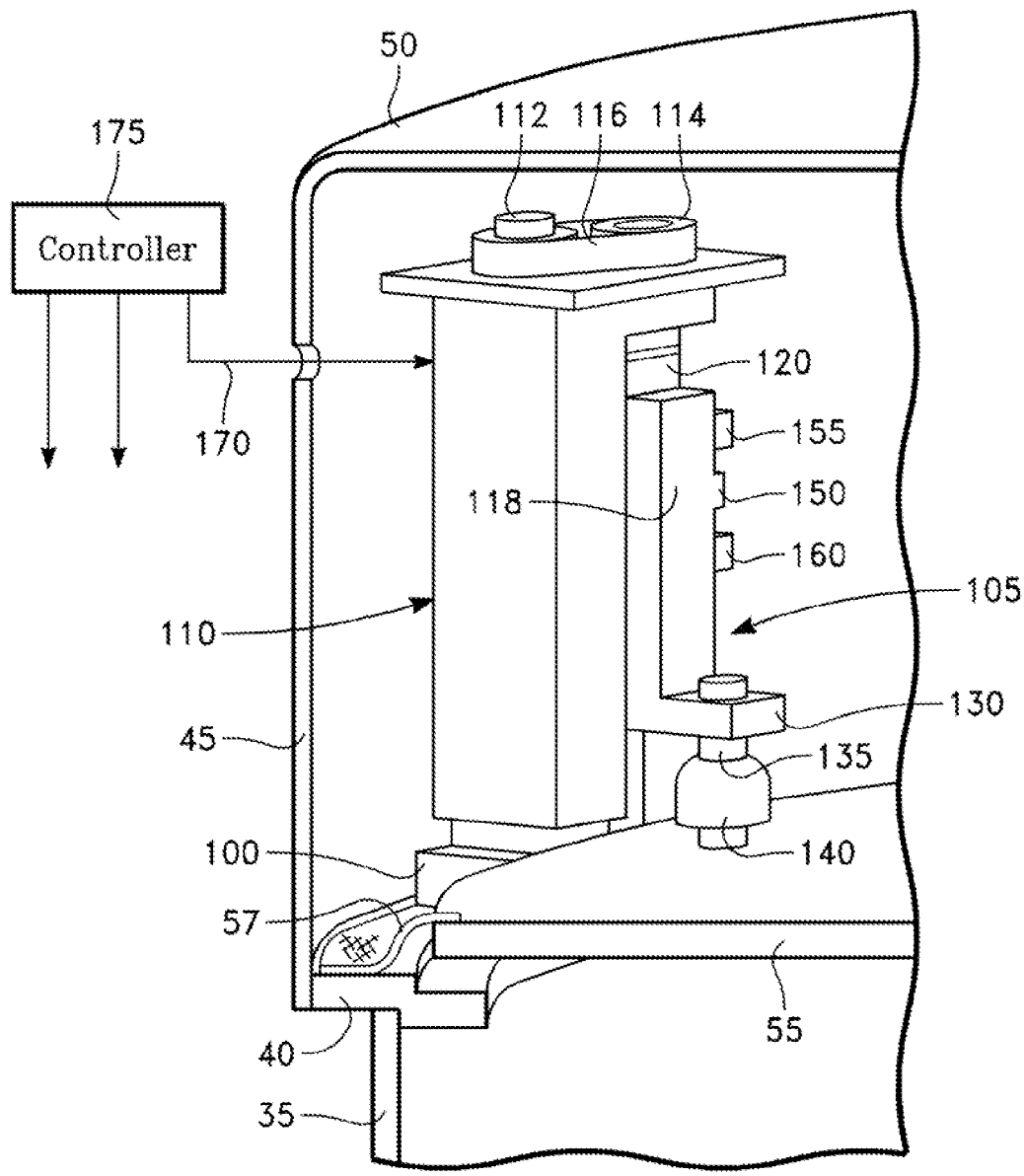
FIG. 3 is an enlarged view of a portion of the reactor of FIG. 1.
Figure 4:
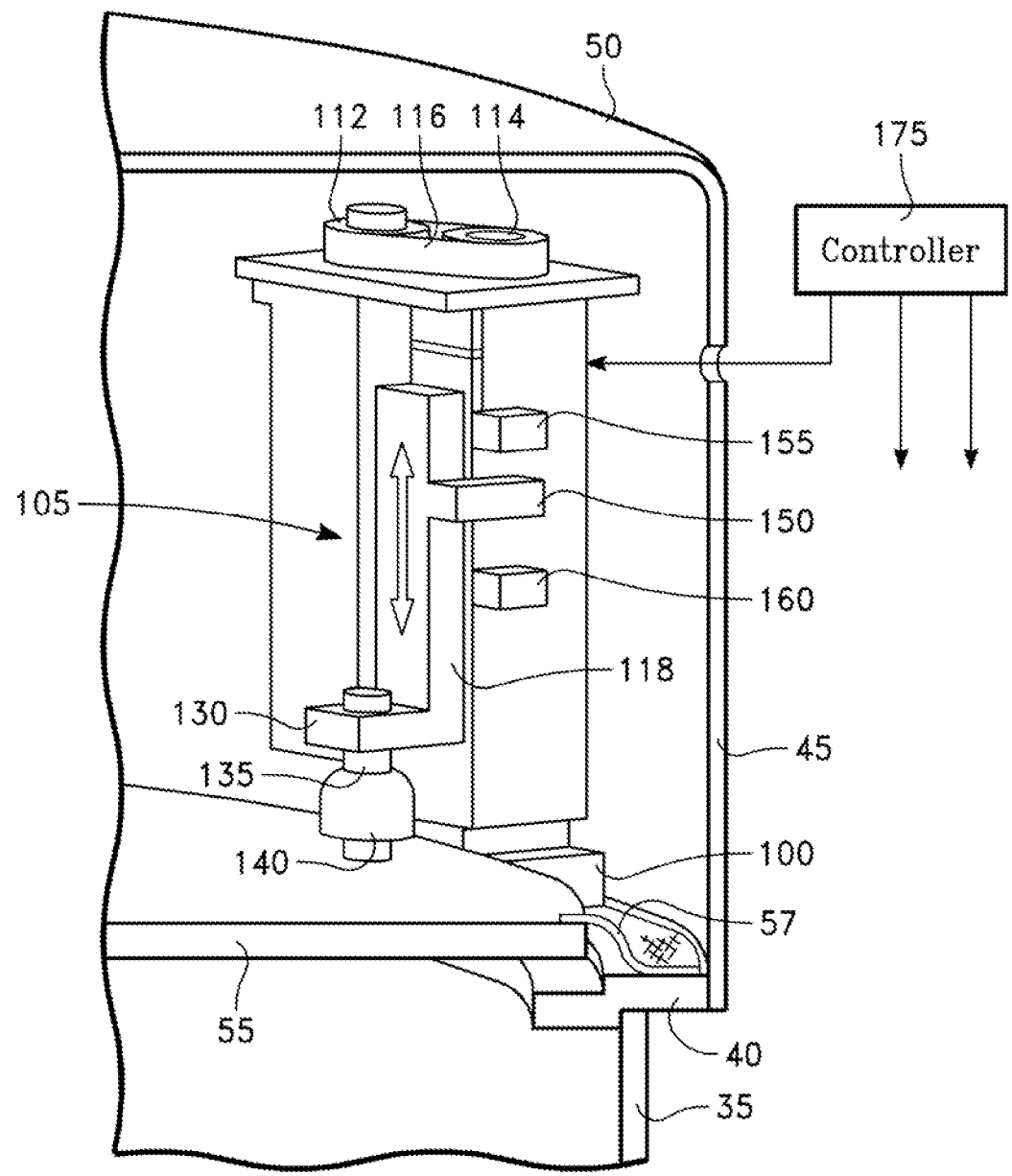
FIG. 4 is another enlarged view corresponding to FIG. 3.

To facilitate understanding, identical reference numerals have been used, where possible, to designate identical elements that are common to the figures. It is contemplated that elements and features of one embodiment may be beneficially incorporated in other embodiments without further recitation. It is to be noted, however, that the appended drawings illustrate only exemplary embodiments of this invention and are therefore not to be considered limiting of its scope, for the invention may admit to other equally effective embodiments.

DETAILED DESCRIPTION

Referring FIGS. 1-4 depict a reactor of the type employed to carry out a reactive ion etch process using an RF inductively coupled plasma. The reactor includes a chamber enclosure 10 including a disk-shaped ceiling 12 and a cylindrical side wall 14 defining a chamber 16. Inside the chamber 16 is a workpiece support pedestal 18 including a bias electrode 20. A plasma bias power generator 22 is coupled through an RF bias impedance match 24 to the bias electrode 20.

An RF enclosure 30 formed of metal is provided above the ceiling 12 and includes a metallic grounded base cylindrical side wall 35 having a top edge 35a supporting a shoulder ring 40, and a conductive top cylindrical side wall 45 extending from the shoulder ring 40 and supporting an overlying conductive cover 50. The cover 50 and the top cylindrical side wall 45 may foe integrally formed together and may be coupled to RF ground.

A process gas supply 51 provides process gas into the chamber 16 through process gas distribution apparatus 52 which may be provided in the side wall 14 (as shown) or in the ceiling 12, for example. A vacuum pump 53 evacuates the chamber 16 through a pumping port 54.

A floating support plate 55 is located on or slightly above the shoulder ring 40, and is supported in a manner to be described below. An inductively coupled plasma source power applicator is supported below the support plate 55 by two sets of brackets 60, 65 extending downwardly from the support plate 55. The plasma source power applicator includes a helical inner coil antenna 70 supported and a helical outer coil antenna 75 concentric with the inner coil antenna 70. The set of brackets 60 support the inner coil antenna 70 while the set of brackets 65 support the outer coil antenna 75. An RF impedance match box 76 rests on the support plate 55. A first RF power generator 77 is coupled to the inner coil antenna 70 through impedance match elements (not shown) in the impedance match box 76. A second RF power generator 78 is coupled to the outer coil antenna 75 through other impedance match elements (not shown) in the impedance match box 76.

A flexible RF gasket 57 provides an RF shield and electrical continuity between the shoulder ring 40 and the floating support plate 55. The RF gasket 57 may be an annular copper mesh, and may be interrupted to accommodate three support servos described below.

The support plate 55 is supported by three support servos 80, 85, 90 placed at equal (120 degree) intervals on the shoulder ring 40. The support servos 80, 85, 90 are identical in one embodiment, and each consists of a support base 100 fastened to a top surface of the shoulder ring 40, a rail and runner block (rail module) 105 and a servo motor (motor module) 110. In the illustrated embodiment, the rail and runner block 105 is fastened to the support base 100 while the servo motor 110 is fastened to the rail and runner block 105, although this relationship may foe modified or reversed in other embodiments. The servo motor 110 rotates a drive pulley 112 and the rail and runner block 105 has a driven pulley 114, the pulleys 112, 114 being linked by a drive belt 116. The rail and runner block 105 has a vertically actuated, elevator block 118 constrained by a linear vertical internal rail 120 within the rail and runner block 105, the elevator block 118 being lifted or depressed along the vertical rail 120 depending upon whether the driven pulley 114 is rotated clockwise or counter clockwise. The elevator block includes a radial arm 130 that extends over the floating support plate 55. A vertical strut 135 supported by the radial arm 130 extends downwardly toward the support plate 55. A conventional rotatable ball joint 140 is coupled between the strut 135 and the support plate 55. Movement of the elevator block 118 raises or lowers the portion of the support plate 55 nearest the servo, depending upon whether the elevator block 118 travels up or down. Movement of the support plate 55 in most instances causes the plate 55 to yaw or roll slightly, which in turn causes the ball joint 140 to articulate.

Optionally, a limit switch 150 may extend laterally from the elevator block 118, and upper and lower limit stops 155, 160 may actuate the limit switch 150 whenever the elevator block reaches predetermined top and bottom end-of-travel points determined by the locations of the limit stops 155, 160. A control signal cable 170 furnishes electrical control signals and power from a central controller 175 of the reactor of FIG. 1. The central controller 175 controls each of the three support servos 80, 85, 90. Placement of the three support servos 80, 85, 90 at equal intervals around the shoulder ring 40 enables the controller 175 to rotate the floating support plate 55 about any tilt axis oriented along any azimuthal angle θ relative to an axis of symmetry of the reactor chamber 16.

Figure 5:
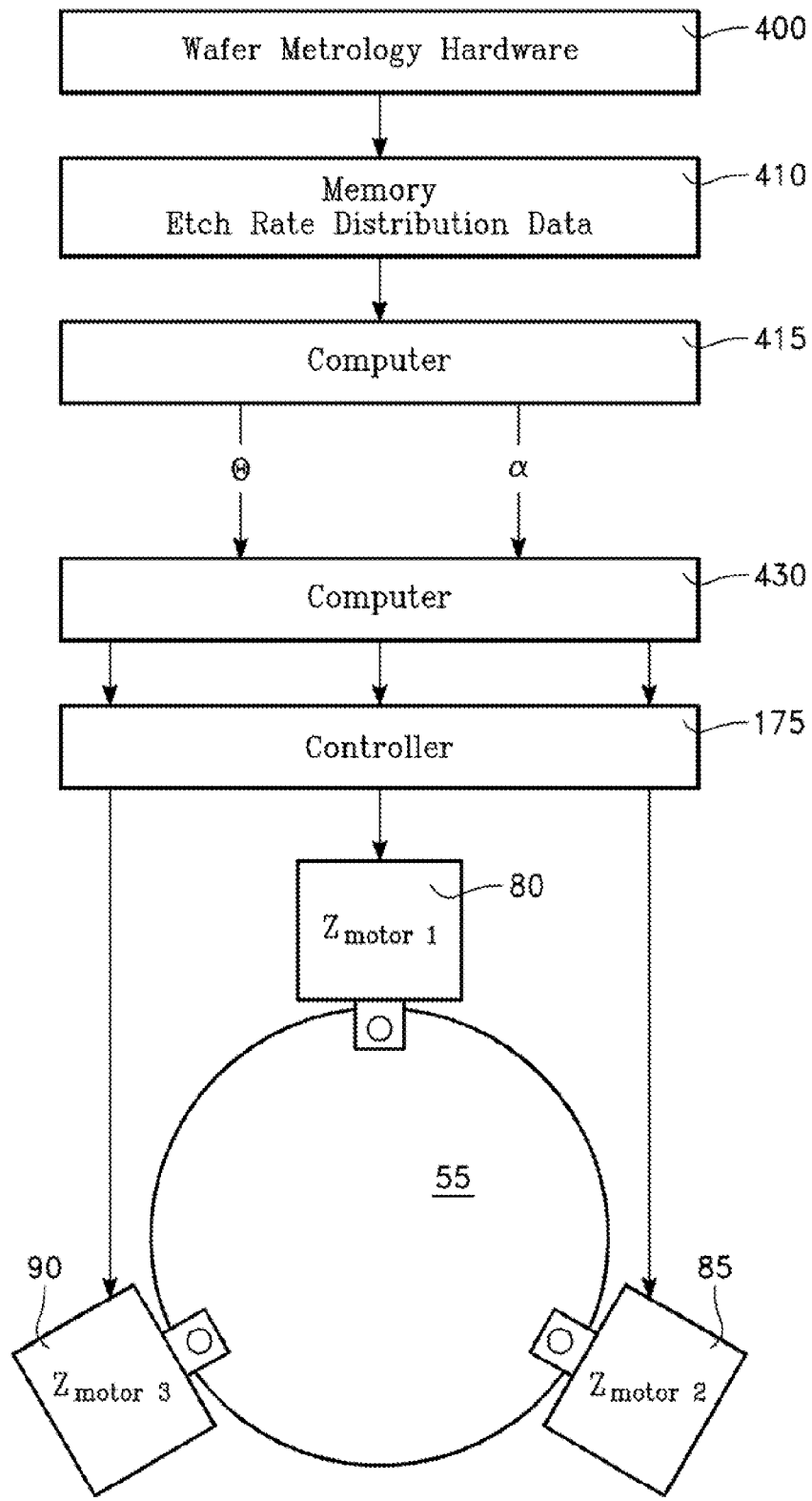
FIG. 5 is a block diagram of a control system included in the reactor of FIG. 1.

FIG. 5 depicts an integration of the reactor of FIG. 1 into a system for correcting for non-uniformity in etch rate distribution. The system includes a conventional measurement instrument or hardware 400 for measuring etch rate distribution across the surface of a workpiece or semiconductor wafer that has been subjected to a reactive ion etch process in the reactor of FIG. 1. A memory 410 stores the etch rate distribution data measured by the hardware 400. A computer 415 processes the etch rate distribution data stored, in the memory 410 and deduces from that data an azimuthal angle θ defining the major axis of skew in the etch rate data. The computer 415 may further determine, from the magnitude of the skew (difference in etch rates across the major axis of skew) a desired tilt angle α by which the support plate 55 may be rotated about the major axis of skew lying along the angle θ that most likely to correct the skew. A computer 430 computes, from θ and α, the vertical deflection of the elevator block 118 of each of the three servos 80, 85, 90 that will produce the desired tilt angle α of rotation about the major axis of skew lying along the angle θ. This information is fed to the central controller 175, which then enables the three servos 80, 85, 90 to execute the desired motion of the floating support plate 55.

Figure 6:
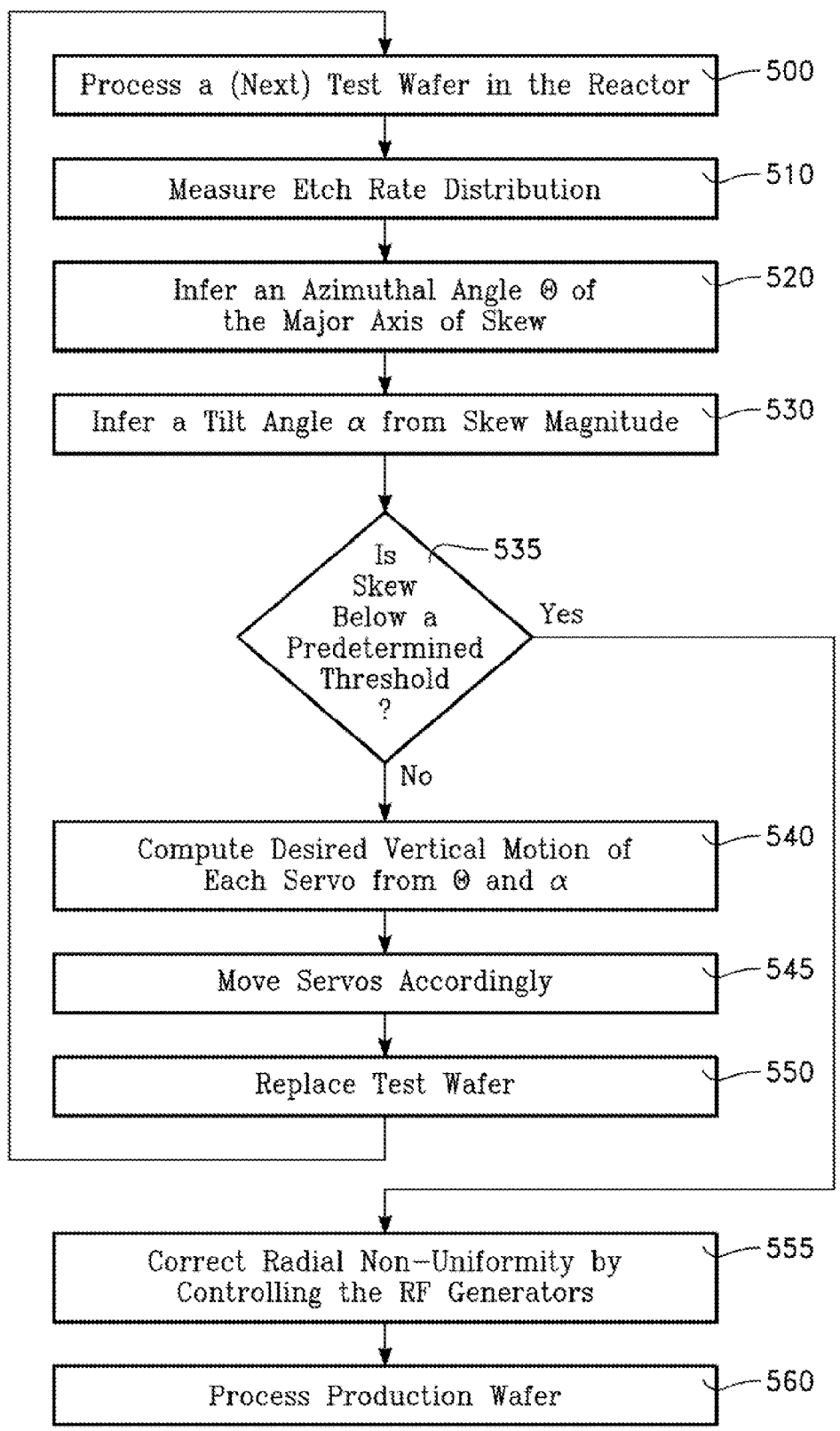
FIG. 6 is a block flow diagram depicting operation of the control system of FIG. 5.

FIG. 6 depicts a method of operating the system of FIG. 5. First, a test wafer is processed in the reactor of FIG. 1 (block 500 of FIG. 6), and an etch rate distribution across the surface of the wafer is obtained (block 510). An azimuthal angle θ defining the major axis of skew is inferred from the etch rate distribution (block 520). Further, a tilt angle α about the major axis of skew is also inferred from the etch rate distribution (block 530) and specifically from the magnitude of the skew, or the difference between etch rates on opposite sides of the major axis of skew. If the magnitude of the skew is below a predetermined threshold or negligible (YES branch of block 535, then the skew correction process is skipped. Otherwise (NO branch of block 535, the vertical (Z-axis) movement of each one of the three servos 80, 85, 90 is computed from α and θ (block 540) and the servos are commanded accordingly (block 545). A new test wafer replaces the previous test wafer (block 550) and the process is repeated.

Continuing with the YES branch of block 535, if the skew magnitude is below a predetermined threshold or is negligible, then skew correction is halted. Any significant etch rate non-uniformity that remains is symmetrical (i.e., radial) so that the controller 175 may now correct the radial non-uniformity by adjusting the apportionment of RF power delivered to the concentric inner and outer coils 70, 75 (block 555 of FIG. 6). The controller 175 may perform this correction by directly adjusting the output power levels of the RF power generators 77 and 78. In one embodiment, for example, the computer 415 may be adapted to deduce the non-uniformity in the radial distribution of etch rate in the data stored in the memory 410, and further deduce from this information a change in output RF power levels of the two generators 77 and 78. This change is then conveyed by the computer 415 to the controller 175, to adjust the output power levels of the RF generators 77 and 78 accordingly. Thereafter, the reactor is prepared to process a production wafer (block 560) with minimal or no non-uniformity In etch rate distribution.

Figure 7:
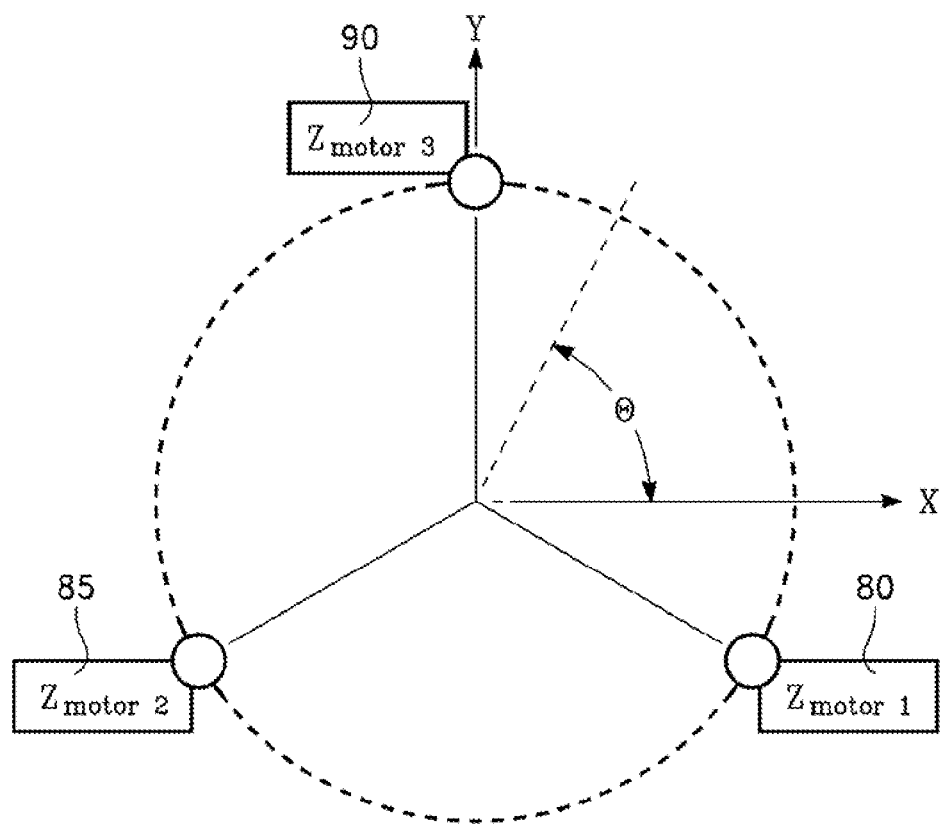
FIG. 7 depicts a coordinate system employed in the control system of FIG. 5 to control the motion of the overhead coil source of FIG. 1 in accordance with an embodiment.
Figure 8:
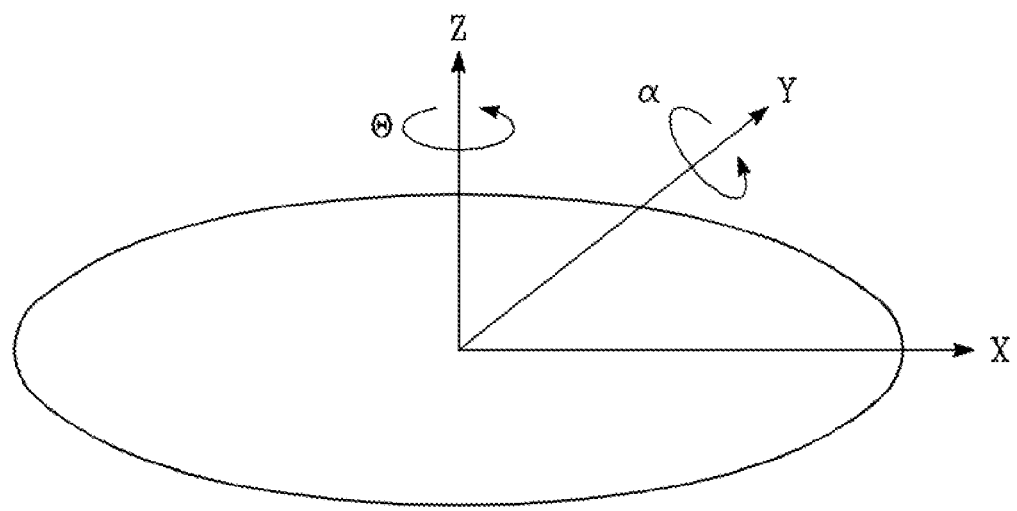
FIG. 8 is a diagram depicting the three-dimensional locations of the actuators of the reactor of FIG. 1 in one implementation.

FIG. 7 depicts an X-Y-Z coordinate system used to locate the three servos 80, 85, 90, and defines the angles of rotation $\theta$ and $\alpha$ with respect to the X, Y and Z axes. Specifically, the angle $\theta$ is a rotation about the Z axis while the angle $\alpha$ is a rotation about the Y axis. The major axis of skew, inferred from the etch distribution data measured on a test wafer, lies in the X-Y plane of FIG. 7 and is defined with respect to the Y axis by a certain value of the angle $\theta$. Skew correction is performed by tilting the support plate 55 about the skew axis by a particular tilt angle $\alpha$. FIG. 8 depicts the X, Y, Z coordinates of the locations of the bail joints of the three servos 80, 85, 90 in one working example. The vertical motion required for each of the three servos may be computed directly from $\theta$ and $\alpha$. Using the definitions of FIGS. 7 and 8, the computer 415 of FIG. 5 employs the following algorithms to compute the vertical motion of each of the three servos from the angles $\alpha$ and $\theta$ in units of inches:

$$Z(\text{motor 1})=10.2278(-\sin \alpha)(\cos \theta)+5.905(\sin \alpha)(\sin \theta)$$

$$Z(\text{motor 2})=10.2278(\sin \alpha)(\cos \theta)+5.905(\sin \alpha)(\sin \theta)$$

$$Z(\text{motor 3})=11.81(-\sin \alpha)(\sin \theta).$$

The foregoing algorithms were obtained by transforming the vector location of each servo by a rotation about the Z axis through an angle $\theta$ and by a rotation about the Y axis by an angle $\alpha$.

Figure 9:
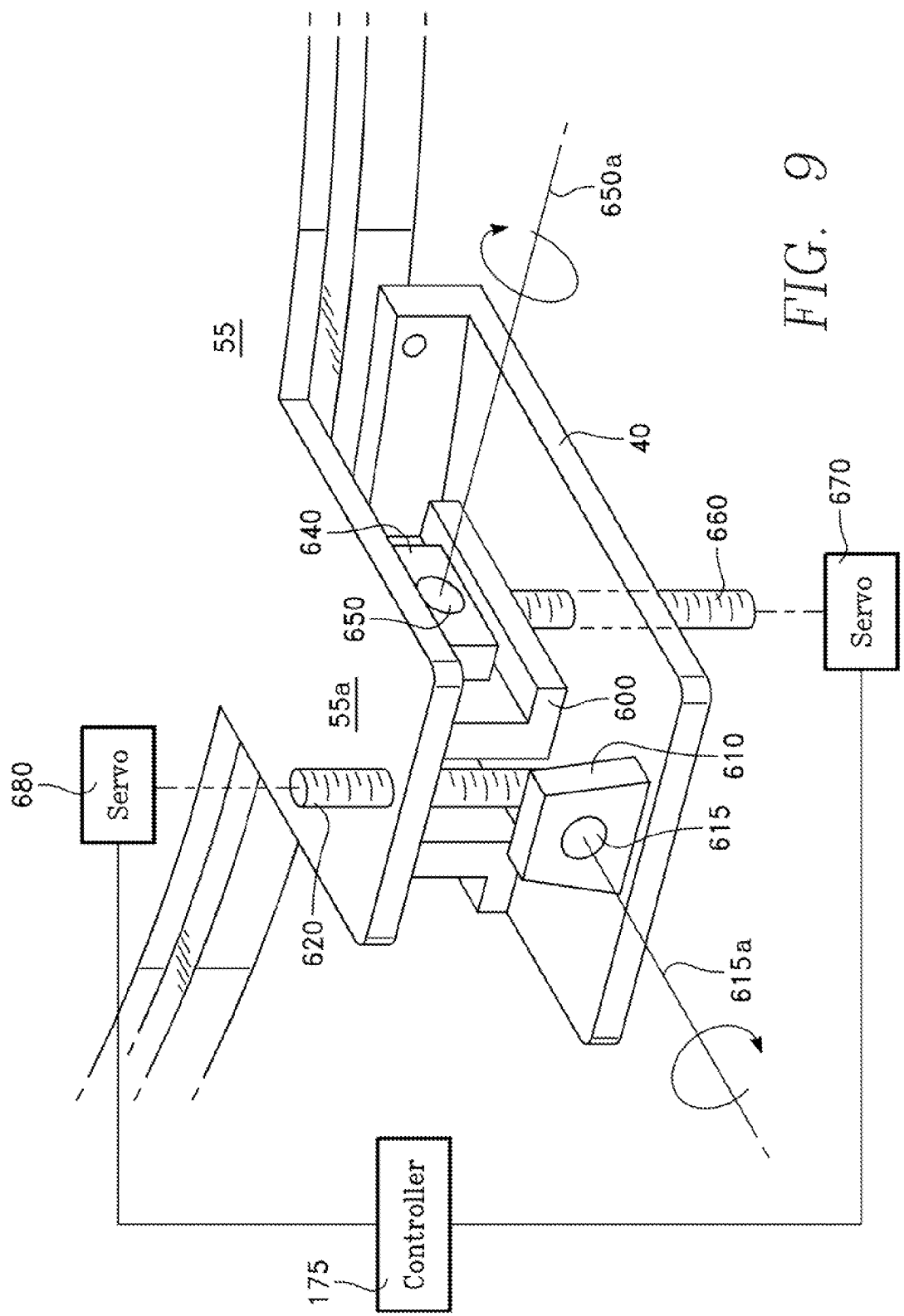
FIG. 9 depicts a reactor in accordance with alternative embodiment.

FIG. 9 depicts an alterative embodiment, in which the floating support plate 55 of FIG. 1 is tilted by a single mechanism that replaces the three support servos 80, 85, 00. In the embodiment of FIG. 9, the radial width of the shoulder ring 40 is enlarged. A floating cradle 600 engages the support plate 55 near the periphery of the support plate 55. In one embodiment, the support plate 55 may be provided with a radial tab 55a at its periphery that engages the floating cradle 600. A roll axis block 610 is engaged, with the floating cradle 600 and is constrained by a roll axis pin 615 that is fixed to the shoulder ring 40 to rotate about a roll axis 615a. A roll axis set screw 620 is threadably extends through and is threadably engaged with the roll axis block 610. The roll axis set screw 620 pushes against a top surface of the shoulder ring 40, and thereby controls the rotational position of the roll axis block 610 about the roll axis 615a. A yaw axis block 640 is engaged with the floating cradle 600 and is constrained by a yaw axis pin 650 that is fixed to the shoulder ring 40 to rotate about a yaw axis 650a. A yaw axis set screw 660 extends through and is threadably engaged with the shoulder ring 40 and pushes against a bottom surface of the yaw axis block 640, and thereby controls the rotational position of the yaw axis block 640 about the yaw axis 650a. By rotations of the two screws 620, 660, the support plate 55 may be rotated about a major axis lying along any desired azimuthal angle $\theta$ by any desired tilt angle $\alpha$. The screws 620, 660 may be controlled by the controller 175 through actuators 670, 680, respectively. The computer 430 of FIG. 5 may be programmed to translate desired values of $\alpha$ and $\theta$ into corresponding rotations of the screws 620, 660, and the corresponding rotations of the screws 620, 660 may be transmitted to the controller 175 to initiate corresponding rotations by the actuators 670, 680.

While the foregoing is directed to embodiments of the present invention, other and further embodiments of the invention may be devised without departing from the basic scope thereof, and the scope thereof is determined by the claims that follow.

What is claimed is:

1. A plasma reactor for processing a workpiece, comprising:
    a processing chamber enclosure comprising a chamber side wall and a chamber ceiling, and a workpiece holder within said processing chamber enclosure;
    a conductive RF enclosure overlying said chamber ceiling and comprising a RF enclosure side wall coupled to an overlying conductive top cyclindrical side wall that supports and overlying conductive cover;
    a floating support plate within and separate from said RF enclosure side wall;
    plural RF plasma power applicators suspended from said floating support plate in a space below said floating support plate and above said chamber ceiling;
    plural actuators and fixed with respect to said RF enclosure side wall and spaced about said RF enclosure side wall at periodic intervals, each one of said plural actuators comprising:
    an axially movable arm, a motor coupled to said axially movable arm and a rotatable joint having two joint ends, one of said joints ends being connected to said axially movable arm and the other of said joint ends being connected to a portion of said floating support plate, whereby said floating support plate is supported at respective plural locations by the rotatable joints of respective one of said plural actuators.

2. The plasma reactor of claim 1 wherein said plural actuators constitute three actuators spaced at 120 degree intervals along said RF enclosure side wall, whereby said actuators are able to tilt said floating support plate about a tilt axis oriented at any azimuthal angle.

3. The plasma reactor of claim 2 further comprising controller apparatus controlling each one of said plural actuators and programmed to compute axial motions of said plural actuators from desired values of said azimuthal angle $\theta$ of said tilt axis and a tilt angle $\alpha$ about said tilt axis.

4. The plasma reactor of claim 3 further comprising a metrology apparatus for measuring etch rate distribution on a test workpiece wherein said controller apparatus is further programmed to infer a major axis of skew from said etch rate distribution and define said tilt axis as said major axis of skew.

5. The plasma reactor of claim 4 further comprising plural RF power sources, each of said plural RF power sources being coupled to a corresponding one of said plural RF plasma power applicators, wherein said controller apparatus controls power output levels of said plural RF power sources, said controller apparatus being programmed to adjust said power output levels for improving uniformity of radial distribution of plasma ion density in said processing chamber.

6. The plasma reactor of claim 5 wherein said plural RF source power applicators comprise plural concentric helical conductor windings.

7. The plasma reactor of claim 5 further comprising an RF impedance match apparatus within said conductive RF enclosure and over said floating support plate, said plural RF power sources being connected to said plural RF source power applicators through respective components of said RF impedance match apparatus.

8. The plasma reactor of claim 1 wherein: each of said plural actuators comprises a motor module coupled to said motor-driven axial movable arm, and a rail module supporting said motor-driven axially movable arm side-by-side with said motor module and coupled to said motor module.

\* \* \* \* \*